US 11,326,056 B2

(12) United States Patent
Iguchi et al.

(10) Patent No.: US 11,326,056 B2
(45) Date of Patent: May 10, 2022

(54) RADIATION CURABLE ORGANOSILICON RESIN COMPOSITION

(71) Applicant: Shin-Etsu Chemical Co., Ltd., Tokyo (JP)

(72) Inventors: Hiroyuki Iguchi, Annaka (JP); Tsutomu Kashiwagi, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 194 days.

(21) Appl. No.: 16/669,120

(22) Filed: Oct. 30, 2019

(65) Prior Publication Data
US 2020/0131367 A1 Apr. 30, 2020

(30) Foreign Application Priority Data
Oct. 31, 2018 (JP) .............................. JP2018-205432

(51) Int. Cl.
| | | |
|---|---|---|
| C08J 3/28 | (2006.01) |
| C08L 83/04 | (2006.01) |
| C08K 3/013 | (2018.01) |
| C08K 5/5415 | (2006.01) |
| C08K 3/36 | (2006.01) |
| C08K 5/132 | (2006.01) |

(52) U.S. Cl.
CPC ............... C08L 83/04 (2013.01); C08J 3/28 (2013.01); C08K 3/013 (2018.01); C08K 5/5415 (2013.01); C08K 3/36 (2013.01); C08K 5/132 (2013.01); C08K 2201/011 (2013.01); C08L 2201/14 (2013.01); C08L 2203/20 (2013.01)

(58) Field of Classification Search
CPC ........... C08G 77/045; C08L 43/04; C08J 3/28
See application file for complete search history.

(56) References Cited

U.S. PATENT DOCUMENTS

| | | |
|---|---|---|
| 4,733,942 A | 3/1988 | Hida et al. |
| 2007/0112090 A1 | 5/2007 | Kashiwagi |
| 2014/0106111 A1* | 4/2014 | Nam ............... G03F 7/027 |
| | | 428/76 |
| 2014/0275319 A1 | 9/2014 | Yamada et al. |
| 2019/0233670 A1 | 9/2019 | Matsumoto et al. |

FOREIGN PATENT DOCUMENTS

| | | |
|---|---|---|
| EP | 2 720 085 A1 | 4/2014 |
| JP | 2007-131812 A | 5/2007 |
| JP | 2010-248446 A | 11/2010 |
| JP | 2018-150512 A | 9/2018 |
| WO | WO 2013/062090 A1 | 5/2013 |
| WO | WO 2018/003381 A1 | 1/2018 |

OTHER PUBLICATIONS

Extended European Search Report dated Feb. 20, 2020, in European Patent Application No. 19205261.1.

* cited by examiner

*Primary Examiner* — Kuo Liang Peng
(74) *Attorney, Agent, or Firm* — Birch, Stewart, Kolasch & Birch, LLP

(57) ABSTRACT

One of the purposes of the present invention is to provide a radiation curable organosilicon resin composition which offers a cured product having a sufficient gas barrier property and which further has workability enough for use in spin coating or inkjetting. The present invention provides a radiation curable organosilicon resin composition comprising 100 parts by mass of (A) a (meth)acryloyloxy group-containing organosilane represented by the formula (1) which has a (meth)acryloyloxy group or a monovalent organic group having 4 to 25 carbon atoms and having one, two, or three of said (meth)acryloyloxy group, and 1 to 50 parts by mass of (B) a photopolymerization initiator.

10 Claims, No Drawings

RADIATION CURABLE ORGANOSILICON RESIN COMPOSITION

CROSS REFERENCE

This application claims the benefits of Japanese Patent Application No. 2018-205432 filed on Oct. 31, 2018, the contents of which are hereby incorporated by reference.

FIELD OF THE INVENTION

The present invention relates to a radiation curable organosilicon resin composition.

Radiation curable resins have more excellent rapid curing properties, low temperature curing properties and workability, compared to heat curable resins. Various radiation curable resins such as silicone resins, acrylic resins, epoxy resins, and urethane resins have been used, depending upon applications. In recent years, the sizes of semiconductor chips and packages became smaller and, therefore, the sizes of lenses, sealants, and adhesives used therefore also became small. Therefore, ultrathin film lenses, sealants and adhesives of a radiation curable resin have been manufactured with a spin coater or an inkjet printer.

Since silicone resins are excellent in heat resistance, transparency and flexibility and, therefore, they are used for lenses and sealants for semiconductors. Radiation curable silicone resins for semiconductor sealants or inkjet printing are known. For example, WO2013/062090, Patent Literature 1, describes an active energy ray-curable ink for inkjet printing, which comprises an organo-modified silicone acrylate having a specific structure. WO2018/003381, Patent Literature 2, describes a UV curable silicone composition comprising a specific UV curable organopolysiloxane component, a monofunctional ethylene group-containing compound having no siloxane structure, and/or a polyfunctional ethylene group-containing compound having no siloxane structure. JP application Laid-Open No. 2007-131812, Patent Literature 3, describes a radiation curable silicone rubber composition having a silicon-containing group having plural (meth)acryloyloxy groups at the terminals.

PRIOR LITERATURES

Patent Literature 1: WO2013/062090
Patent Literature 2: WO2018/003381
Patent Literature 3: JP Application Laid-Open No. 2007-131812

However, silicone resins usually have many siloxane bonds as described in the Patent Literature, so that their intermolecular force is weak and the silicone resins are inferior in a gas barrier property. Therefore, the silicone resins having many siloxane bonds as described in the Patent Literature are not suitable for applications requiring a gas barrier property.

The present invention has been made in consideration of this problem. One of the purposes of the present invention is to provide a radiation curable organosilicon resin composition which offers a cured product having a sufficient gas barrier property and which further has workability enough for use in spin coating or inkjetting.

The present inventors have made research and found that a radiation curable organosilicon resin composition which comprises an organosilicon compound represented by the following formula (1) having two or more (meth)acryloyloxy groups and having from 1 to 3 main-chain siloxane units and a light curable resin provides a cured product having a sufficient gas barrier property and further has workability enough for use in spin coating or inkjetting.

Thus, the present invention provides a radiation curable organosilicon resin composition comprising
100 parts by mass of (A) a compound represented by the following formula (1):

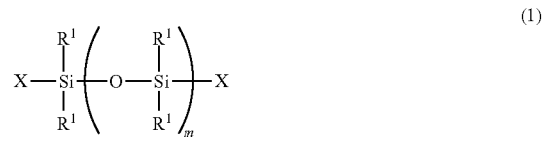

wherein $R^1$ is, independently of each other, a group selected from the group consisting of saturated hydrocarbon groups having 1 to 12 carbon atoms and aromatic hydrocarbon groups having 6 to 12 carbon atoms, m is an integer of from 0 to 2, and X is a (meth)acryloyloxy group represented by the following formula (2) or a monovalent organic group having 4 to 25 carbon atoms and having one, two, or three of said (meth)acryloyloxy group,

wherein $R^2$ is a hydrogen atom or a methyl group, and
1 to 50 parts by mass of (B) a photopolymerization initiator.

EFFECTS OF THE INVENTION

The radiation curable organosilicon resin composition of the present invention provides a cured product having a sufficient gas barrier property and further has workability enough for use in spin coating or inkjet. Specifically, the present radiation curable organosilicon resin composition cures rapidly by irradiation in the atmosphere.

DETAILED DESCRIPTION OF THE INVENTION

The present invention will be described in more detail.
[Component (A)]
Component (A) is a (meth)acryloyloxy group-containing organosilane compound represented by the following formula (1):

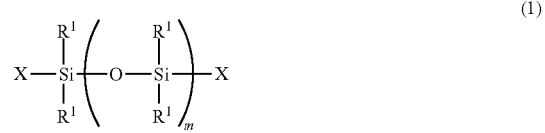

wherein $R^1$ is, independently of each other, a group selected from the group consisting of a saturated hydrocarbon group having 1 to 12 carbon atoms or an aromatic hydrocarbon group having 6 to 12 carbon atoms, m is an integer of from 0 to 2, X is a (meth)acryloyloxy group represented by the following formula (2) or a monovalent organic group having 4 to 25 carbon atoms and having one, two or three of said (meth)acryloyloxy group.

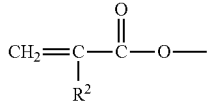

(2)

wherein $R^2$ is a hydrogen atom or a methyl group.

In the formula (1), m is an integer of from 0 to 2, preferably 0 or 1. If m is larger than the aforesaid upper limit, the cured product is inferior in a gas barrier property.

$R^1$ is, independently of each other, a saturated hydrocarbon group having 1 to 12 carbon atoms or an aromatic hydrocarbon group having 6 to 12 carbon atoms, preferably a saturated hydrocarbon group having 1 to 6 carbon atoms or an aromatic hydrocarbon group having 6 to 12 carbon atoms, more preferably an aromatic hydrocarbon group having 6 to 12 carbon atoms. Examples of the saturated hydrocarbon group include alkyl groups such as a methyl, ethyl, propyl or butyl group and cycloalkyl groups such as a cyclopentyl or cyclohexyl group, and those hydrocarbon groups wherein a part or all of the hydrogen atoms bonded to a carbon atom of those groups is substituted with a substituent such as a halogen atom such as a fluorine atom, a bromine atom and a chlorine atom, a cyano group, a glycidyloxy group, a mercapto group, and an amino group, for instance, halogenated monovalent saturated hydrocarbon groups such as a trifluoropropyl group and a chloropropyl group; cyano alkyl group such as a β-cyanoethyl group and a γ-cyanopropyl group; a 3-glycidyloxypropyl group, a 3-mercaptopropyl group, and a 3-aminopropyl group. Among these, a methyl group and a cyclohexyl group are preferred, and a methyl group is particularly preferred.

Examples of the aromatic hydrocarbon group include aryl groups such as a phenyl, tolyl, naphthyl or biphenyl group, and aralkyl groups such as a benzyl, phenylethyl or phenylpropyl group, and those aromatic hydrocarbon groups wherein a part or all of the hydrogen atoms bonded to a carbon atom of those groups is substituted with a substituent such as a halogen atom such as a fluorine atom, a bromine atom and a chlorine atom or a cyano group. Among these, at least one of $R^1$ is preferably a group selected from a phenyl group, a naphthyl group and a biphenyl group.

X is a (meth)acryloyloxy group represented by the following formula (2) or a monovalent organic group which has 4 to 25 carbon atoms and one, two or three of the (meth)acryloyloxy group, preferably a (meth)acryloyloxy group or a (meth)acryloyloxy group-containing monovalent organic group having 5 to 20 carbon atoms, further preferably 5 to 15 carbon atoms.

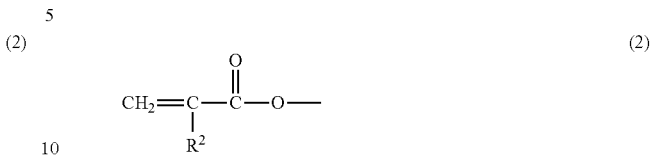

(2)

wherein $R^2$ is a hydrogen atom or a methyl group.

The (meth)acryloyloxy group-containing monovalent organic group which has 3 to 25 carbon atoms and one, two or three of the (meth)acryloyloxy group is specifically represented by the following formula.

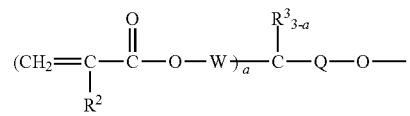

wherein $R^2$ is, independently of each other, a hydrogen atom or a methyl group, $R^3$ is, independently of each other, a hydrogen atom, an alkoxy group having 1 to 6 carbon atoms, an aryloxy or aralkyloxy group having 6 to 12 carbon atoms, an aliphatic hydrocarbon group having 1 to 6 carbon atoms, or an aromatic hydrocarbon group having 6 to 12 carbon atoms, Q is a single bond or an alkylene group having 1 to 6 carbon atoms, W is a single bond or a divalent hydrocarbon group which has 1 to 6 carbon atoms and may have an ether bond, a is an integer of from 1 to 3.

Thus, the compound represented by the aforesaid formula (1) is specifically represented by the following formula (I) or (II).

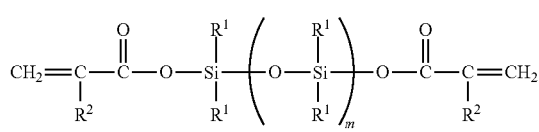

(I)

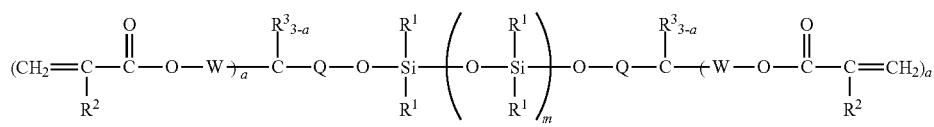

(II)

$R^3$ is, independently of each other, a hydrogen atom, an alkoxy group having 1 to 6 carbon atoms, an aryloxy or aryloxyalkyl group having 6 to 12 carbon atoms, an aliphatic hydrocarbon group having 1 to 6 carbon atoms, or an aromatic hydrocarbon group having 6 to 12 carbon atoms. Examples of the aliphatic hydrocarbon group and the aromatic hydrocarbon group include those given as the examples for $R^1$. Examples of the alkoxy group include alkyloxy groups such as a methoxy, ethoxy, propoxy or butoxy group and cycloalkyloxy groups such as a cyclopentyloxy or cyclohexyloxy group. Among these, a methoxy group and an ethoxy group are preferred, and a methoxy group is particularly preferred. Examples of the aryloxy group include a phenoxy, tolyloxy, naphthoxy or biphenyloxy group. Examples of the aryloxyalkyl group include a phenyloxymethyl, phenyloxyethyl or phenyloxypropyl group. Among these, a phenoxy group is preferred. $R^3$ is preferably a hydrogen atom, an alkoxy group having 1 to 3 carbon atoms, an aryloxy group having 6 to 10 carbon atoms, an alkyl group having 1 to 3 carbon atoms, or an aryl group having 6 to 10 carbon atoms, more preferably a hydrogen atom, an alkoxy group having 1 or 2 carbon atoms, an aryloxy group having 6 to 8 carbon atoms, an alkyl group having 1 or 2 alkyl groups, or an aryl group having 6 to 8 carbon atoms.

Q is a single bond or an alkylene group having 1 to 6, preferably 1 to 4 carbon atoms, more preferably a single bond or an alkylene group having 1 to 3 carbon atoms, and further preferably a single bond or a methylene group. n is an integer of from 1 to 6, preferably an integer from 1 to 4, more preferably 1 or 2; and a is an integer of from 1 to 3, preferably 2 or 3. W is a divalent hydrocarbon group which has 1 to 6, preferably 1 to 3, carbon atoms and may have an ether bond. Examples of W include alkylene groups such as a methylene group and an ethylene group and oxyalkylene groups such as an oxyethylene group. Preferred are an alkylene group having 1 to 6, more preferably 1 to 3 carbon atoms, and particularly a methylene group.

Examples of the (meth)acryloyloxy group-containing organic group, X, include groups represented by the following formulas:

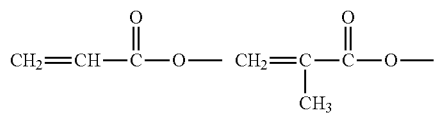

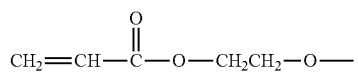

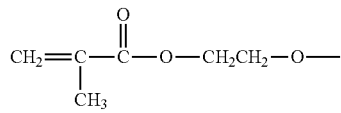

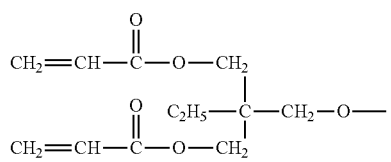

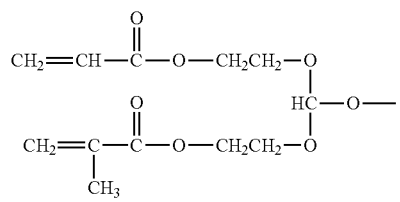

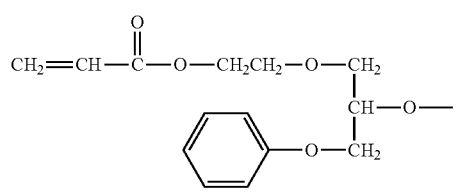

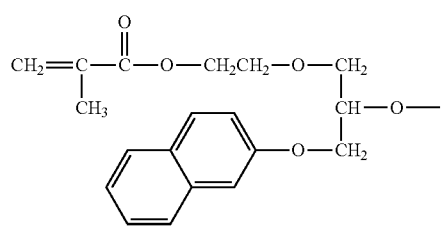

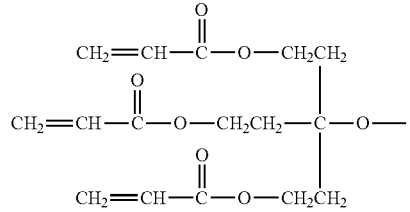

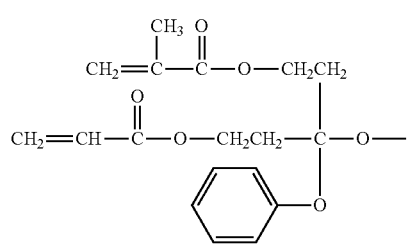

Examples of component (A) include compounds represented by the following formulas, but not limited to these.

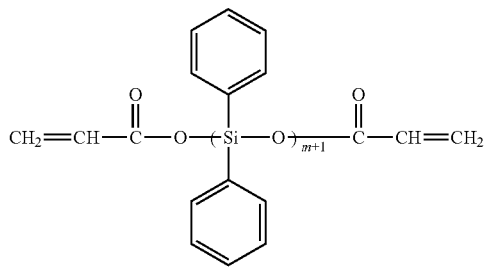

-continued

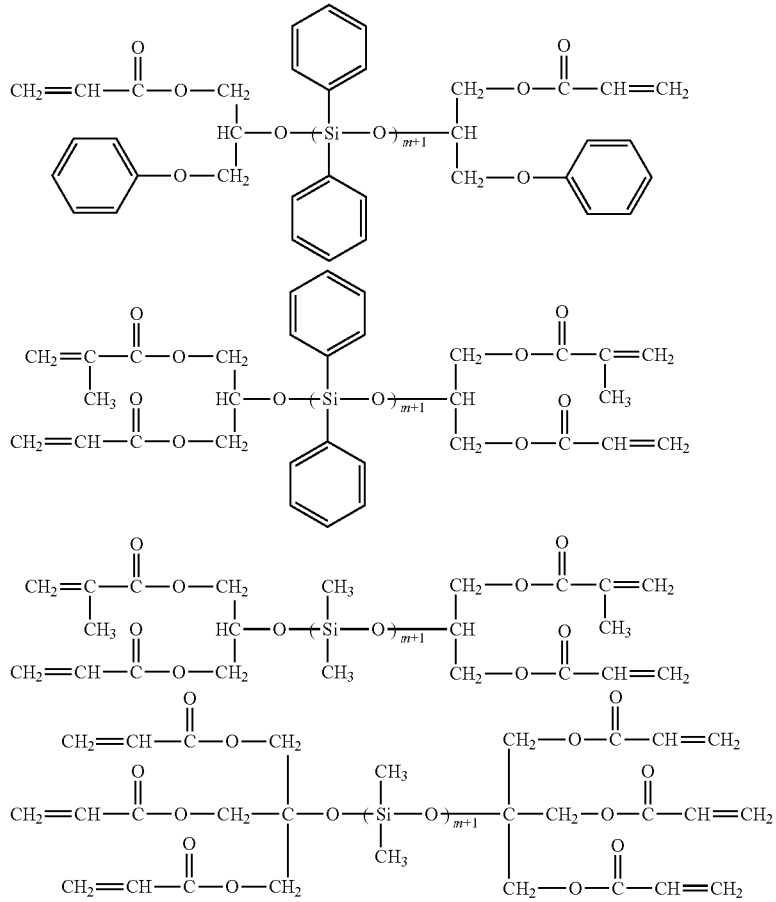

Component (A) may be prepared according to any known manner. For example, an organic compound containing a (meth)acryloyloxy group and a hydroxyl group and a chlorosilyl group-containing organosiloxane are subjected to dehydrochlorination in the presence of a basic catalyst to obtain component (A). The basic catalyst is not particularly limited and may be, for instance, amine catalysts, phosphorus catalysts, sulfur catalysts, hydroxide catalysts, and oxide catalysts. The dehydrochlorination may be conducted in any conventional manner. For instance, the reaction may be conducted at a temperature of from 30 to 60 degrees C. for 2 to 5 hours.

[Component (B)]

Component (B) is a photopolymerization initiator. Any compound which generates a polymerization-active species by radiation may be used. The photopolymerization initiator may be used singly or in combination of two or more. The radiation curable organosilicon resin composition of the present invention cures by radical polymerization. The photopolymerization initiator is prone to receive oxygen inhibition. Therefore, such having at least one selected from a nitrogen atom, a sulfur atom and a phosphorus atom is preferably used in curing the composition in the atmosphere.

Examples of the photopolymerization initiator include benzoyl compounds (or phenylketone compounds) such as benzophenone, particularly, benzoyl compounds (or phenylketone compounds) having a hydroxy group on the α-carbon atom of the carbonyl group, such as 1-hydroxycyclohexylphenylketone, 2-hydroxy-2-methyl-1-phenylpropan-1-one, and 1-(4-isopropylphenyl)-2-hydroxy-2-methylpropan-1-one; α-alkylaminophenone compounds such as 2-methyl-1-(4-methylthiophenyl)-2-morpholinopropan-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butan-1-one; acylphosphine oxide compounds such as 2,4,6-trimethylbenzoyldiphenylphosphine oxide, bisacyl monoorganophosphine oxide, and bis(2,6-dimethoxybenzoyl)-2,4,4-trimethylpentylphosphine oxide; benzoin ether compounds such as isobutylbenzoin ether; ketal compounds such as acetophenone diethyl ketal; thioxanthone-based compounds, and acetophenone-based compounds. In particular, radiation emitted from a UV-LED has a single wavelength. Therefore, when a UV-LED is used as a light source, an α-alkylaminophenone or acylphosphine oxide compounds which have an absorption spectrum peak in a region of from 340 to 400 nm are effective as the photopolymerization initiator.

An amount of the photopolymerization initiator may be such necessary for curing the radiation curable organosilicon resin composition by exposure to radiation such as UV rays. If the amount is too small, the composition does not cure. If the amount is too large, a cured product is fragile or curing does not proceed in a good manner. Therefore, the amount of the photopolymerization initiator is from 1 part by mass to 50 parts by mass according to the invention, preferably from 5 parts by mass to 40 parts by mass, more preferably from 7 parts by mass to 35 parts by mass, still more preferably from 10 parts by mass to 30 parts by mass, relative to 100 parts by mass of component (A). The preferred composition containing the photopolymerization initiator in an amount of from 7 parts by mass to 35 parts by mass, particularly from 10 parts by mass to 30 parts by mass, has a rapid surface curing speed in the atmosphere so as to cure sufficiently in a short time.

The radiation curable organosilicon resin composition of the present invention may contain a thioxanthone sensitizer or a benzophenone sensitizer together with the aforesaid photopolymerization initiator. The term "sensitizer" herein means a compound which is excited by a light having a specific wavelength and transfers an energy to the photopolymerization initiator so as to accelerate initiation of polymerization. The sensitizer returns to the ground state after transferred the energy to the photopolymerization initiator and, then, works as a sensitizer again. Example of the sensitizer includes 2,4-diethylthioxanthone. An amount of the sensitizer may as such in a conventional radiation-curable organosilicon resin composition, preferably from 0.01 part by mass to 5 parts by mass, more preferably from 0.05 part by mass to 2 parts by mass, relative to 100 parts by mass of component (A).

The radiation curable organosilicon resin composition of the present invention preferably has a dynamic viscosity at 25 degrees C. of from 1 to 2,000 mm$^2$/s, more preferably from 5 to 1300 mm$^2$/s, still more preferably from 30 to 1000 mm$^2$/s, further more preferably from 50 to 800 mm$^2$/s, most preferably from 100 to 500 mm$^2$/s, as determined with a Cannon-Fenske viscometer according to the Japanese Industrial Standards(JIS) Z 8803:2011. When the composition has the dynamic viscosity in the range, the composition is easy to handle and may be applied, for instance, by a conventional inkjet apparatus.

[Component (C)]

The radiation curable organosilicon resin composition of the present invention may further comprise an alkoxysilane represented by the following formula (3) and/or a partial hydrolysis condensate thereof.

$$H_{4-n}Si(OR^4)_n \quad (3)$$

wherein $R^4$ is a hydrogen atom or a monovalent hydrocarbon group having 1 to 6 carbon atoms and n is an integer of 3 or 4.

The aforesaid compounds may be used singly or in combination of two or more. The radiation curable organosilicon resin composition comprising the alkoxysilane and/or the partial hydrolysis condensate thereof provides a cured product having better adhesion to various substrates.

Examples of the $R^4$ include alkyl groups such as a methyl, ethyl, propyl, isopropyl, butyl, isobutyl, tert-butyl, or hexyl group; cycloalkyl groups such as a cyclohexyl group; and alkoxy-substituted alkyl groups such as a methoxymethyl, methoxyethyl, ethoxymethyl, or ethoxyethyl group. Of these, a methyl and ethyl groups are preferred. The term "partial hydrolysis condensate of the alkoxysilane" means a siloxane compound which is obtained by a hydrolysis condensation reaction of the alkoxy group, such as siloxane oligomer having 2 to 100, preferably 2 to 30, silicon atoms, and still has at least one, preferably 2 or more, alkoxy groups left in the molecule.

An amount of component (C) is preferably from 0.5 to 10 parts by mass, more preferably from 0.5 to 5 parts by mass, each based on 100 parts by mass of component (A). Then, even though a cured product obtained from the resulting composition has many siloxane bonds, the many siloxane bonds do not adversely affect a gas barrier property of the cured product, and contribute to improved adhesion.

[Component (D)]

The radiation curable organosilicon resin composition of the present invention may further comprise (D) nanoparticles. An amount of the nanoparticles may be 3 to 30 parts by mass, preferably 5 to 25 parts by mass, more preferably 10 to 20 parts by mass, relative to 100 parts by mass of component (A). The nanoparticles convert the wavelength of lights absorbed by the organosilicon resin composition, which is preferred.

In the present invention, the nanoparticles have an average primary particle size of from 1 to 100 nm, preferably from 1 to 50 nm, more preferably from 1 to 30 nm. The average primary particle size within the aforesaid range is preferred from the standpoint of transparency of a molded product obtained from the composition. The average primary particle size is determined by dynamic light scattering.

The nanoparticles are not particularly limited and include, for instance, metal oxides such as silica, alumina, zinc oxide, titanium oxide, zirconium oxide, niobium oxide, tantalum oxide, triiron tetraoxide, lead oxide, tin oxide, cerium oxide, calcium oxide, trimanganese tetraoxide, and magnesium oxide, single metals such as gold, silver, copper, iron, palladium, aluminum, nickel, iron, titanium, manganese, zinc, tungsten, platinum, lead, and tin; alloys such as solder, steel, and stainless steel, and quantum dot materials. Quantum dot materials are semiconductive particles having an average particle size of from 2 to 10 nm. When the quantum dot materials absorb lights from an excitation source to reach an energy excitation state, they emit energy corresponding to an energy band gap of the quantum dots. Examples of the quantum dot materials include cadmium selenide, indium nitride, zinc sulfide, cadmium sulfide, palladium sulfide, and cadmium telluride, and alloys thereof. Among them, as the present component (D), quantum dot materials such as cadmium selenide, cadmium sulfide, and zinc sulfide are preferred. The aforesaid nanoparticles may be used singly or in combination of two or more. A material containing a slight amount of another element, that is, a so-called doped material (quantum dot materials having the another element introduced therein) may also be used.

The nanoparticles may be surface-treated with a silane coupling agent. Any conventional silane coupling agent is usable. Examples of the silane coupling agent having one silicon atom include n-propyltrimethoxysilane, n-propyltriethoxysilane, n-octyltrimethoxysilane, n-octyltriethoxysilane, phenyltrimethoxysilane, phenyltriethoxysilane, methyltrimethoxysilane, methyltriethoxysilane, 2-[methoxy(polyethyleneoxy)propyl]trimethoxysilane, methoxytri(ethyleneoxy)propyltrimethoxysilane, 3-aminopropyltrimethoxysilane, 3-mercaptopropyltrimethoxysilane, 3-(methacryloyloxy)propyltrimethoxysilane, 3-isocyanatopropyltriethoxysilane, 3-isocyanatopropyltrimethoxysiaine, and glycidoxypropyltrimethoxysilane. Examples of a silane coupling agent having two or more silicon atoms include α-trimethoxy(dimethyl)polysiloxane, α-triethoxy(dimethyl)polysiloxane, α-trimethoxy(methylphenyl)polysiloxane, α-triethoxy(methylphenyl)polysiloxane, α-trimethoxy(diphenyl)polysiloxane, and α-triethoxy(diphenyl)polysiloxane.

The radiation curable organosilicon resin composition of the present invention may comprise a fluorescent substance or an inorganic filler other than component (D) in addition to components (A) to (D). These will hereinafter be described.

[Fluorescent Substance]

Any conventional fluorescent substance may be used and not limited. For example, preferred is one that absorbs lights from a semiconductive element, particularly, from a semiconductive light emitting diode with a nitride-based semiconductor as a light emitting layer and converts the wavelengths. Preferred examples of such a fluorescent substance include nitride fluorescent substances and oxynitride fluorescent substances activated mainly by a lanthanoid element such as Eu or Ce, alkaline earth metal halogen apatite fluorescent substances activated mainly by a lanthanoid element such as Eu or a transition metal element such as Mn, alkaline earth metal boric acid halogen fluorescent substances, alkaline earth metal aluminate fluorescent substances, alkaline earth metal silicate fluorescent substances, alkaline earth metal sulfide fluorescent substances, alkaline earth metal thiogallate fluorescent substances, alkaline earth metal silicon nitride fluorescent substances, germinate fluorescent substances, rare earth aluminate fluorescent substances activated mainly by a lanthanoid element such as Ce, rare earth silicate fluorescent substances, organic and organic complex fluorescent substances activated mainly by a lanthanoid element such as Eu, and Ca—Al—Si—O—N-based oxynitride glass fluorescent substances.

Examples of the nitride fluorescent substances activated mainly by a lanthanoid element such as Eu or Ce include $M_2Si_5N_8$:Eu (M is at least one selected from Sr, Ca, Ba, Mg, and Zn). Additional examples include $MSi_7N_{10}$:Eu, $M_{1.8}Si_5O_{0.2}N_8$:Eu, and $M_{0.9}Si_7O_{0.1}N_{10}$:Eu (M is at least one selected from Sr, Ca, Ba, Mg, and Zn).

Examples of the oxynitride fluorescent substances activated mainly by a lanthanoid element such as Eu or Ce include $MSi_2O_2N_2$:Eu (M is at least one selected from Sr, Ca, Ba, Mg, and Zn).

Examples of the alkaline earth metal halogen apatite fluorescent substances activated mainly by a lanthanoid-based element such as Eu or a transition metal-based element such as Mn include $M_5(PO_4)_3X$:R (M is at least one selected from Sr, Ca, Ba, Mg, and Zn; X is at least one selected from F, Cl, Br, and I; and R is any one of Eu, Mn, and Eu+Mn).

Examples of the alkaline earth metal boric acid halogen fluorescent substances include $M_2B_5O_9X$:R (M is at least one selected from Sr, Ca, Ba, Mg, and Zn; X is at least one selected from F, Cl, Br, and I; and R is any one of Eu, Mn, and Eu+Mn.).

Examples of the alkaline earth metal aluminate fluorescent substances include $SrAl_2O_4$:R, $SrAl_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is any one of Eu, Mn, and Eu+Mn).

Examples of the alkaline earth metal sulfide fluorescent substances include $La_2O_2S$:Eu, $Y_2O_2S$:Eu, and $Gd_2O_2S$:Eu.

Examples of the rare earth aluminate fluorescent substances activated mainly by a lanthanoid element such as Ce include YAG-based fluorescent substances represented by the following compositional formulas: $Y_3Al_{15}O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Additional examples include $Tb_3Al_5O_{12}$:Ce and $Lu_3Al_5O_{12}$:Ce, obtained by substituting a part or all of Y with Tb and Lu, respectively.

Examples of other fluorescent substances include ZnS:Eu, $Zn_2GeO_4$:Mn, and $MGa_2S_4$:Eu (M is at least one selected from Sr, Ca, Ba, Mg, and Zn and X is at least one selected from F, Cl, Br, and I).

The fluorescent substances may contain at least one selected from Tb, Cu, Ag, Au, Cr, Nd, Dy, Co, Ni, and Ti instead of Eu or in addition to Eu, if necessary.

The Ca—Al—Si—O—N-based oxynitride glass fluorescent substance is a fluorescent substance having, as a matrix, an oxynitride glass having 20 to 50 mol % of $CaCO_3$ reduced as CaO, 0 to 30 mol % of $Al_2O_3$, 25 to 60 mol % of SiO, 5 to 50 mol % of AlN, and 0.1 to 20 mol % of a rare earth metal oxide or a transition metal oxide, and a total amount of these five components is 100 mol %. The fluorescent substance having an oxynitride glass as a matrix has preferably 15 mass % or less of a nitrogen content and preferably contains, in addition to the rare earth oxide ion, another rare earth element ion as a sensitizer in an amount of from 0.1 to 10 mol % reduced as a rare earth oxide in the fluorescent glass, which functions as a co-activator.

Alternatively, other fluorescent substance other than the aforesaid fluorescent substances and having similar performance and effects may also be used.

An amount of the fluorescent substance is preferably from 0.1 to 2,000 parts by mass, more preferably from 0.1 to 100 parts by mass, relative to 100 parts by mass of component (A). When the cured product of the present invention is a fluorescent substance-containing wavelength conversion film, the content of the fluorescent substance is preferably from 10 to 2,000 parts by mass. The fluorescent substance has an average particle size of preferably 10 nm or more, more preferably from 10 nm to 10 μm, more preferably from 10 nm to 1 μm. The average particle size is determined by particle size distribution measurement in a laser light diffraction method with a Cilas laser analyzer or the like.

[Inorganic Filler]

The inorganic filler other than the nanoparticle (D) preferably has an average particle size of from 1 to 100 μm, more preferably from 1 to 50 μm, further preferably from 1 to 20 μm, as a median diameter measured by a laser diffraction particle size distribution analyzer. Examples of such include silica, fumed silica, fumed titanium dioxide, alumina, calcium carbonate, calcium silicate, titanium dioxide, ferric oxide, and zinc oxide. This inorganic filler may be used singly or in combination of two or more. An amount of the inorganic filler is not particularly limited, and may be 20 parts by mass or less, preferably from 0.1 to 10 parts by mass, relative to 100 parts by mass of component (A).

[Other Additives]

The composition of the present invention may contain, in addition to the aforesaid components, other additives. Examples of the other additives include antiaging agents, radical chain inhibitors, flame retardants, surfactants, antiozonants, light stabilizers, thickening agents, plasticizers, antioxidants, heat stabilizers, conductivity imparting agents, antistatic agents, radiation shielding agents, nucleating agents, phosphorous-based peroxide decomposers, lubricants, pigments, metal inactivators, physical property adjusting agents, and organic solvents. These optional components may be used either singly or in combination of two or more.

The radiation curable organosilicon resin composition of the present invention is prepared by mixing component (A), component (B), optionally, components (C) and (D), and the other components in the amounts described above. The curing method and conditions of the radiation curable organosilicon resin composition are not particularly limited. For instance, the composition is irradiated by a light of a wavelength of 365 nm with an LED in an accumulated irradiation of 600 to 800 mJ/cm$^2$.

The cured product according to the present invention has excellent heat resistance, light resistance, transparency, and curing properties. Therefore, the cured product is useful for applications such as display materials, inkjet inks, nanoimprint materials, optical recording medium materials, optical apparatus materials, optical part materials, optical fiber materials, optical-electronic functional organic materials, and peripheral materials for semiconductor integrated circuit.

EXAMPLES

The present invention will be explained below in further detail with reference to a series of the Examples, and the present invention is in no way limited by these Examples.

Synthesis Example 1

Dichlorodiphenylsilane (506 g) and toluene (506 g) were placed in a 5-L brown flask. After stirring for 10 minutes, 2-hydroxy-3-phenoxypropyl acrylate (977 g, "KAYARAD R-128H", ex Nippon Kayaku) was added, followed by stirring for 10 minutes. Triethylamine (607 g) was added dropwise to the mixture, followed by stirring at 60 degrees C. for 3 hours. The mixture was subjected to filtration to remove solids and to distillation at a reduced pressure to obtain a compound (A-1) represented by the following formula.

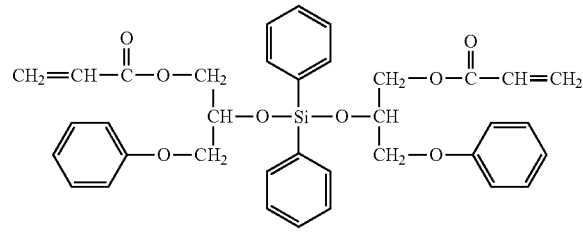

(A-1)

Synthesis Example 2

Dichlorodiphenylsilane (506 g) and toluene (506 g) were placed in a 5-L brown flask. After stirring for 10 minutes, 2-hydroxy-3-acryloyloxypropyl methacrylate (854 g, "NK Ester 701A", ex Shin-Nakamura Chemical) was added, followed by stirring for 10 minutes. Triethylamine (547 g) was added dropwise to the mixture, followed by stirring at 60 degrees C. for 3 hours. The mixture was subjected to filtration to remove solids and to distillation at a reduced pressure to obtain a compound (A-2) represented by the following formula.

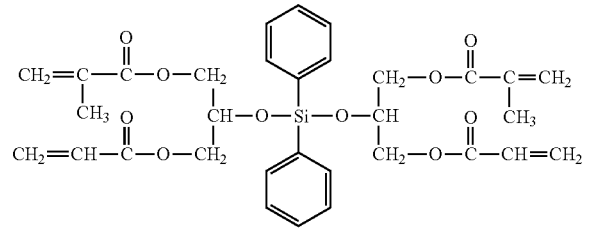

(A-2)

Synthesis Example 3

Dichlorodimethylsilane (258 g) and toluene (258 g) were placed in a 5-L brown flask. After stirring for 10 minutes, 2-hydroxy-3-acryloyloxypropyl methacrylate (854 g, "NK Ester 701A") was added, followed by stirring for 10 minutes. Triethylamine (547 g) was added dropwise to the mixture, followed by stirring at 60 degrees C. for 3 hours. The mixture was subjected to filtration to remove solids and to distillation at a reduced pressure to obtain a compound (A-3) represented by the following formula.

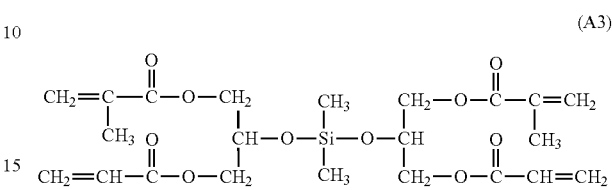

(A-3)

Synthesis Example 4

Dichlorodimethylsilane (258 g) and toluene (258 g) were placed in a 5-L brown flask. After stirring for 10 minutes, pentaerythritol triacrylate (1,302 g, "NK Ester A-TMM-3LM-N", triester content: 57%, ex Shin-Nakamura Chemical) was added, followed by stirring for 10 minutes. Triethylamine (605 g) was added dropwise to the mixture, followed by stirring at 60 degrees C. for 3 hours. The mixture was subjected to filtration to remove solids and to distillation at a reduced pressure to obtain a compound (A-4) represented by the following formula.

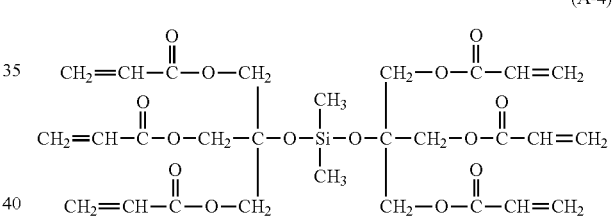

(A-4)

Synthesis Example 5

Diphenylsilanediol (432 g) and toluene (864 g) were placed in a 5-L brown flask. After stirring for 10 minutes, acryloyl chloride (398 g) was added, followed by stirring for 10 minutes. Triethylamine (605 g) was added dropwise to the mixture, followed by stirring at 60 degrees C. for 12 hours. The mixture was subjected to filtration to remove solids and to distillation at a reduced pressure to obtain a compound (A-5) represented by the following formula.

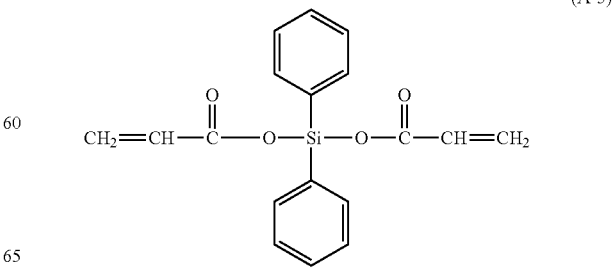

(A-5)

Synthesis Example 6

1,1,3,3-Tetramethyl-1,3-dichlorodisiloxane (406 g) and toluene (406 g) were placed in a 5-L brown flask. After stirring for 10 minutes, 2-hydroxy-3-acryloyloxypropyl methacrylate (854 g, "NK Ester 701A") was added, followed by stirring for 10 minutes. Triethylamine (547 g) was added dropwise to the mixture, followed by stirring at 60 degrees C. for 3 hours. The mixture was subjected to filtration to remove solids and to distillation at a reduced pressure to obtain a compound (A-6) represented by the following formula.

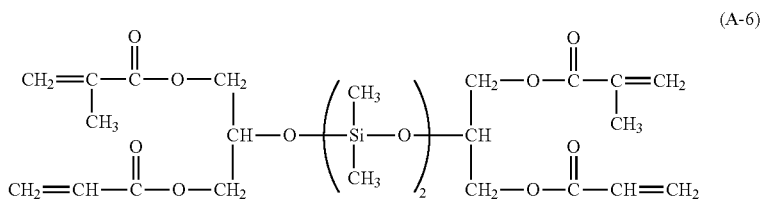

(A-6)

Synthesis Example 7

1,1,3,3,5,5-Hexamethyl-1,5-dichlorodisiloxane (555 g) and toluene (555 g) were placed in a 5-L brown flask. After stirring for 10 minutes, 2-hydroxy-3-acryloyloxypropyl methacrylate (854 g, "NK Ester 701A") was added, followed by stirring for 10 minutes. Triethylamine (547 g) was added dropwise to the mixture, followed by stirring at 60 degrees C. for 3 hours. The mixture was subjected to filtration to remove solids and to distillation at a reduced pressure to obtain a compound (A-7) represented by the following formula.

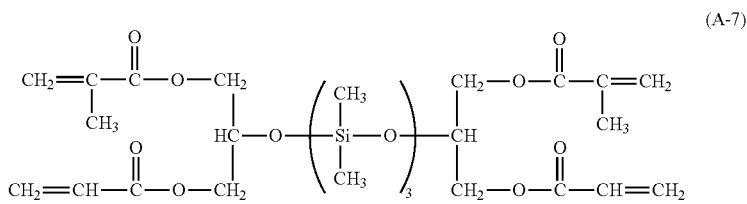

(A-7)

Comparative Synthesis Example 1

α,ω-Dichloropolydimethylsiloxane having the number of the repeating units "n" of 100 and a number average molecular weight "Mn" of 7,500 (750 g) and toluene (1,500 g) were placed in a 5-L brown flask. After stirring for 10 minutes, 2-hydroxy-3-phenoxypropyl acrylate (49 g, "KAYARAD R-128H") was added, followed by stirring for 10 minutes. Triethylamine (30 g) was added dropwise to the mixture, followed by stirring at 60 degrees C. for 3 hours. The mixture was subjected to filtration to remove solids and to distillation at a reduced pressure to obtain a compound (A'-1) represented by the following formula.

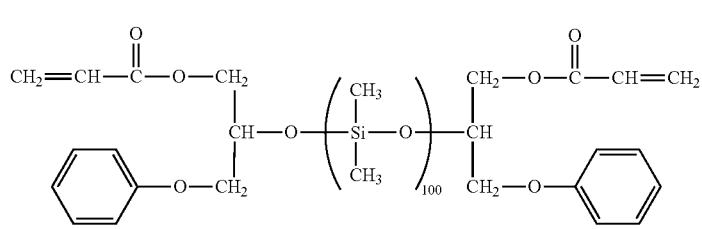

(A'-1)

Comparative Synthesis Example 2

1,1,3,3,5,5,7,7-Octamethyl-1,7-dichlorotetrasiloxane (703 g) and toluene (703 g) were placed in a 5-L brown flask. After stirring for 10 minutes, 2-hydroxy-3-acryloyloxypropyl methacrylate (759 g, "NK Ester 701A") was added, followed by stirring for 10 minutes. Triethylamine (489 g) was added dropwise to the mixture, followed by stirring at 60 degrees C. for 3 hours. The mixture was subjected to filtration to remove solids and to distillation at a reduced pressure to obtain a compound (A'-2) represented by the following formula.

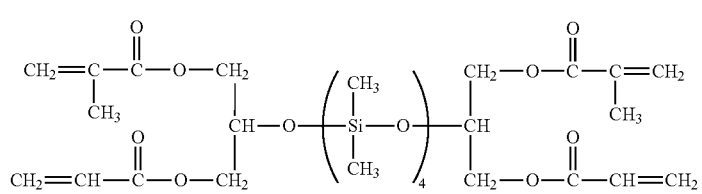

(A'-2)

Referential Example 1

100 Parts by mass of compound (A-1) obtained in Synthesis Example 1, 5 parts by mass of 2-hydroxy-2-methyl-1-phenylpropan-1-one ("Omnirad 1173", ex. IGM Resins) (B-1), and 5 parts by mass of 2,4,6-trimethylbenzoyl-diphenyl phosphine oxide ("Omnirad TPO H", ex. IGM Resins) (B-2) were mixed to prepare composition 1.

Example 2

100 Parts by mass of compound (A-2) obtained in Synthesis Example 2 and 20 parts by mass of 2-dimethylamino-2-(4-methyl-benzyl)-1-(4-morpholin-4-yl-phenyl)-butan-1-one ("Omnirad 379EG", ex. IGM Resins) (B-1) were mixed to prepare composition 2.

Example 3

100 Parts by mass of compound (A-3) obtained in Synthesis Example 3 and 10 parts by mass of 2-methyl-1-[4-(methylthio)phenyl]-2-morpholinopropan-1-one ("Omnirad 907", ex. IGM Resins) (B-1) were mixed to prepare composition 3.

Example 4

100 Parts by mass of compound (A-4) obtained in Synthesis Example 4, 10 parts by mass of 2-hydroxy-2-methyl-1-phenylpropan-1-one ("Omnirad 1173", ex. IGM Resins) (B-1) and 5 parts by mass of bis(2,4,6-trimethylbenzoyl) phenylphosphine oxide ("Omnirad 819", ex. IGM Resins) (B-5) were mixed to prepare composition 4.

Referential Example 5

100 Parts by mass of compound (A-5) obtained in Synthesis Example 5 and 20 parts by mass of 2-hydroxy-2-methyl-1-phenylpropan-1-one ("Omnirad 1173", ex. IGM Resins) (B-1) were mixed to prepare composition 5.

Example 6

100 Parts by mass of compound (A-6) obtained in Synthesis Example 6 and 10 parts by mass of 2-methyl-1-[4-(methylthio)phenyl]-2-morpholinopropan-1-one ("Omnirad 907", ex. IGM Resins) (B-4) were mixed to prepare composition 6.

Example 7

100 Parts by mass of compound (A-7) obtained in Synthesis Example 7 and 10 parts by mass of 2-methyl-1-[4-(methylthio)phenyl]-2-morpholinopropan-1-one ("Omnirad 907", ex. IGM Resins) (B-4) were mixed to prepare composition 7.

Referential Example 8

100 Parts by mass of compound (A-1) obtained in Synthesis Example 1, 5 parts by mass of 2-hydroxy-2-methyl-1-phenylpropan-1-one ("Omnirad 1173", ex. IGM Resins) (B-1), 5 parts by mass of 2,4,6-trimethylbenzoyl-diphenyl phosphine oxide ("Omnirad TPO H", ex. IGM Resins) (B-2) and 2 parts by mass of partial hydrolysis and condensation of tetramethoxysilane having three repeating units on average were mixed to prepare composition 8.

Example 9

100 Parts by mass of compound (A-2) obtained in Synthesis Example 2, 5 parts by mass of 2-hydroxy-2-methyl-1-phenylpropan-1-one ("Omnirad 1173", ex. IGM Resins)

(B-1), 5 parts by mass of 2,4,6-trimethylbenzoyl-diphenyl phosphine oxide ("Omnirad TPO H", ex. IGM Resins) (B-2) and 10 parts by mass of quantum dot material having an average primary particle size of 5 nm ("Perovskite quantum dots", ex. Sigma-Aldrich) (D-1) were mixed to prepare composition 9.

Referential Example 10

100 Parts by mass of compound (A-1) obtained in Synthesis Example 1, 5 parts by mass of 2-hydroxy-2-methyl-1-phenylpropan-1-one ("Omnirad 1173", ex. IGM Resins) (B-1), 5 parts by mass of 2,4,6-trimethylbenzoyl-diphenyl phosphine oxide ("Omnirad TPO H", ex. IGM Resins) (B-2) and 30 parts by mass of nanosilica having an average primary particle size of 20 nm ("TOL-ST", ex. Nissan Chemical Corporation) (D-2) were mixed to prepare composition 10.

Referential Example 11

100 Parts by mass of compound (A-1) obtained in Synthesis Example 1, 3 parts by mass of 2-hydroxy-2-methyl-1-phenylpropan-1-one ("Omnirad 1173", ex. IGM Resins) (B-1) and 3 parts by mass of 2,4,6-trimethylbenzoyl-diphenyl phosphine oxide ("Omnirad TPO H", ex. IGM Resins) (B-2) were mixed to prepare composition 11.

Comparative Example 1

100 Parts by mass of compound (A'-1) obtained in Comparative Synthesis Example 1, 5 parts by mass of 2-hydroxy-2-methyl-1-phenylpropan-1-one ("Omnirad 1173", ex. IGM Resins) (B-1) and 5 parts by mass of 2,4,6-trimethylbenzoyl-diphenyl phosphine oxide ("Omnirad TPO H", ex. IGM Resins) (B-2) were mixed to prepare composition 13.

Comparative Example 2

100 Parts by mass of compound (A'-2) obtained in Comparative Synthesis Example 2, 10 parts by mass of 2-hydroxy-2-methyl-1-phenylpropan-1-one ("Omnirad 1173", ex. IGM Resins) (B-1) and 5 parts by mass of bis(2,4,6-trimethylbenzoyl)phenylphosphine oxide ("Omnirad 819", ex. IGM Resins) (B-5) were mixed to prepare composition 14.

Comparative Example 3

100 Parts by mass of compound (A-1) obtained in Synthesis Example 1, 30 parts by mass of 2-hydroxy-2-methyl-1-phenylpropan-1-one ("Omnirad 1173", ex. IGM Resins) (B-1) and 30 parts by mass of 2,4,6-trimethylbenzoyl-diphenyl phosphine oxide ("Omnirad TPO H", ex. IGM Resins) (B-2) were mixed to prepare composition 12.

Each of the compositions 1 to 14 obtained in Examples 1 to 11 and Comparative Examples 1 to 3 was subjected to the following determinations. The results are as shown in table 1.

[Dynamic Viscosity]

The dynamic viscosity at 25 degrees C. of each of the compositions was determined by the method using a Cannon-Fenske viscometer according to the Japanese Industrial Standards (JIS) Z 8803:2011.

[Tensile Strength and Elongation at Break]

Each of the compositions was poured in a mold having a depth of 2 mm, a width of 120 mm, and a length of 170 mm and placed in a nitrogen-purged vessel. Then, the composition was eradiated by ultraviolet rays in a conveyer furnace equipped with two UV-LED lamps (ex Nichia Corporation) having a peak top at 365 nm (illuminance: 3,000 mW/cm$^2$) for 0.2 second (accumulated eradiation: 600 mJ/cm$^2$) to obtain a cured product of a sheet form having a thickness of 2 mm. The tensile strength and the elongation at break of the cured sheet product were determined according to JIS K 6249-2003.

[Surface Cure Speed]

Each of the compositions was poured in a mold having a depth of 1 mm, a width of 20 mm, and a length of 20 mm and eradiated by a UV-LED (ex Nichia Corporation) at an illuminance of 10 mW/cm$^2$ in the atmosphere while touching the surface of the composition by a finger. The UV-LED had a peak top at 365 nm. A time required for tackiness at the surface to disappear was recorded.

[Water Vapor Permeability]

Each of the compositions was poured in a mold having a width of 1 mm, a width of 120 mm, and a length of 170 mm and eradiated by ultraviolet rays having amount of energy (estimated light intensity) of 600 mJ/cm$^2$ for 0.2 second in a conveyor furnace (illuminance: 3,000 mW/cm$^2$) equipped with two UV-LED lamps having a peak top at 365 nm to obtain a cured sheet having a thickness of 1 mm. A water vapor permeability of the cured sheet was determined by a water vapor permeability tester ("Lyssy L80-5000", ex Systech Instruments).

TABLE 1

| | | Ref. Ex. 1 | Ex. 2 | Ex. 3 | Ex. 4 | Ref. Ex. 5 | Ex. 6 | Ex. 7 |
|---|---|---|---|---|---|---|---|---|
| Component (A) | (A-1) | 100 | — | — | — | — | — | — |
| | (A-2) | — | 100 | — | — | — | — | — |
| | (A-3) | — | — | 100 | — | — | — | — |
| | (A-4) | — | — | — | 100 | — | — | — |
| | (A-5) | — | — | — | — | 100 | — | — |
| | (A-6) | — | — | — | — | — | 100 | — |
| | (A-7) | — | — | — | — | — | — | 100 |
| Component (B) | (B-1) | 5 | — | — | 10 | 20 | — | — |
| | (B-2) | 5 | — | — | — | — | — | — |
| | (B-3) | — | 20 | — | — | — | — | — |
| | (B-4) | — | — | 10 | — | — | 10 | 10 |
| | (B-5) | — | — | — | 5 | — | — | — |

TABLE 1-continued

|  |  |  | Ref. Ex. 1 | Ex. 2 | Ex. 3 | Ex. 4 | Ref. Ex. 5 | Ex. 6 | Ex. 7 |
|---|---|---|---|---|---|---|---|---|---|
| Results | Dynamic viscosity, 25 degrees C. | mm$^2$/s | 900 | 700 | 300 | 2000 | 300 | 400 | 500 |
|  | Surface cure speed | Sec. | 10 | 5 | 7 | 5 | 15 | 7 | 7 |
|  | Tensile strength, 25 degrees C. | MPa | 20 | 20 | 5 | 25 | 20 | 5 | 6 |
|  | Elongation at break, 25 degrees C. | % | 10 | 10 | 40 | 5 | 5 | 50 | 60 |
|  | Water vapor permeability, 40 degrees C. | g/m$^2$ · day | 3 | 3 | 6 | 2 | 3 | 8 | 9 |

TABLE 2

|  |  |  | Ref. Ex. 8 | Ex. 9 | Ref. Ex. 10 | Ref. Ex. 11 | Com. Ex. 1 | Com. Ex. 2 | Com. Ex. 3 |
|---|---|---|---|---|---|---|---|---|---|
| Component (A) | (A-1) |  | 100 | — | 100 | 100 | — | — | 100 |
|  | (A-2) |  | — | 100 | — | — | — | — | — |
| Comparative Compound | (A-1') |  | — | — | — | — | 100 | — | — |
|  | (A-2') |  | — | — | — | — | — | 100 | — |
| Component (B) | (B-1) |  | 5 | 5 | 5 | 3 | 5 | 10 | 30 |
|  | (B-2) |  | 5 | 5 | 5 | 3 | 5 | — | 30 |
|  | (B-5) |  | — | — | — | — | — | 5 | — |
| Component (C) | (C-1) |  | 2 | — | — | — | — | — | — |
| Component (D) | (D-1) |  | — | 10 | — | — | — | — | — |
|  | (D-2) |  | — | — | 30 | — | — | — | — |
| Results | Dynamic viscosity, 25 degrees C. | mm$^2$/s | 800 | 900 | 1300 | 1000 | 5000 | 400 | 600 |
|  | Surface cure speed | Sec. | 10 | 10 | 10 | 50 | 30 | 20 | uncured |
|  | Tensile strength, 25 degrees C. | MPa | 20 | 18 | 23 | 20 | 3 | 5 | uncured |
|  | Elongation at break, 25 degrees C. | % | 10 | 10 | 5 | 10 | 80 | 40 | uncured |
|  | Water vapor permeability, 40 degrees C. | g/m$^2$ · day | 3 | 3 | 2 | 3 | 50 | 15 | uncured |

As seen in Table 1, the composition containing the (meth)acryloyloxy group-containing organosilicon compound in Comparative Example 1 had many siloxane repeating units and, thus, had many siloxane bonds, whereby the cured product had a high water vapor permeability and, thus, an inferior gas barrier property. Further, the composition of Comparative Example 1 had a too high viscosity and, thus, inferior workability. The composition containing a (meth)acryloyloxy group-containing organosilicon compound in Comparative Example 2 also had many siloxane repeating units and, thereby, the cured product had a high water vapor permeability and an inferior gas barrier property. The resin composition of Comparative Example 3 contained a too large amount of the photopolymerization initiator, so that a polymerization reaction stopped soon after started. As a result, a polymer having a large molecular weight was not obtained. That is, the resin composition did not provide a cured product.

On the other hand, the radiation curable organosilicon resin composition of the present invention contains a (meth)acryloyloxy group-containing organosilicon compound having a limited number of siloxane bonds and, thereby, provides a cured product having a low water vapor permeability and an excellent gas barrier property. Further, because the compound has two or more (meth)acryloyloxy groups, a cured product has excellent mechanical strength such as tensile strength and elongation at break. The radiation curable organosilicon resin composition of the present invention has a low viscosity, so that it may be applied even in spin coating or inkjet printing, which offers excellent workability. Further, the present composition may comprise a proper amount of a photopolymerization initiator and, then, cures instantly by exposure to radiation in the atmosphere.

The radiation curable organosilicon resin composition and the cured product thereof according to the present invention have excellent heat resistance, light resistance, transparency, and curing properties. Therefore, they are useful for applications such as display materials, inkjet inks, nanoimprint materials, optical recording medium materials, optical apparatus materials, optical device part materials, optical fiber materials, optical-electronic functional organic materials, and peripheral part materials of semiconductor integrated circuits.

The invention claimed is:

1. A radiation curable organosilicon resin composition comprising 100 parts by mass of (A) a compound represented by the following formula (1):

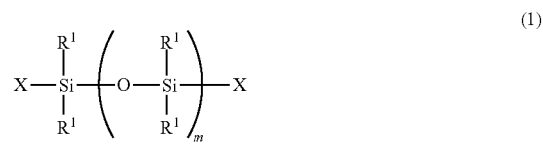

(1)

wherein R$^1$ is, independently of each other, a group selected from the group consisting of saturated hydrocarbon groups having 1 to 12 carbon atoms and aromatic hydrocarbon groups having 6 to 12 carbon atoms, m is an integer of from 0 to 2, and X is a monovalent organic group represented by the following formula,

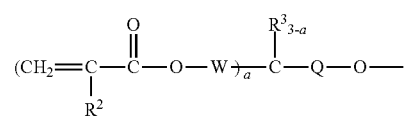

wherein R$^2$ is, independently of each other, a hydrogen atom or a methyl group, R$^3$ is, independently of each other, a hydrogen atom, an alkoxy group having 1 to 6 carbon atoms, an aryloxy or aryloxyalkyl group having 6 to 12 carbon atoms, an aliphatic hydrocarbon group having 1 to 6 carbon atoms, or an aromatic hydrocarbon group having 6 to 12 carbon atoms, Q is a single bond or an alkylene group having 1 to 6 carbon atoms, W is a single bond or a divalent hydrocarbon group which has 1 to 6 carbon atoms and may have an ether bond, and a is an integer of 2 or 3, and 1 to 50 parts by mass of (B) a photopolymerization initiator.

2. The radiation curable organosilicon resin composition according to claim 1, wherein $R^3$ is a hydrogen atom, an alkoxy group having 1 to 3 carbon atoms, an aryloxy group having 6 to 10 carbon atoms, an alkyl group having 1 to 3 carbon atoms, or an aryl group having 6 to 10 carbon atoms.

3. The radiation curable organosilicon resin composition according to claim 1 or 2, wherein Q is a single bond or an alkylene group having 1 to 3 carbon atoms.

4. The radiation curable organosilicon resin composition according to claim 1, having a dynamic viscosity at 25 degrees C. of from 1 to 2,000 mm²/s as determined according to the Japanese Industrial Standards(JIS) Z 8803:2011.

5. The radiation curable organosilicon resin composition according to claim 1, wherein component (B) is a photopolymerization initiator at least having any one kind selected from a nitrogen atom, a sulfur atom and a phosphorus atom.

6. The radiation curable organosilicon resin composition according to claim 1, wherein the amount of component (B) is 10 to 30 parts by mass.

7. The radiation curable organosilicon resin composition according to claim 1, further comprising 0.5 to 10 parts by mass of (C) an alkoxysilane represented by the following formula (3) and/or a partial hydrolysis condensate thereof,

wherein $R^4$ is a hydrogen atom or a monovalent hydrocarbon group having 1 to 6 carbon atoms and n is an integer of 3 or 4.

8. The radiation curable organosilicon resin composition according to claim 1, wherein at least one of $R^1$ in the formula (1) is selected from a phenyl group, a naphthyl group, and a biphenyl group.

9. The radiation curable organosilicon resin composition according to claim 1, further comprising 3 to 30 parts by mass of (D) nanoparticles.

10. The radiation curable organosilicon resin composition according to claim 9, wherein component (D) is a quantum dot material.

* * * * *